US012751263B2

(12) United States Patent
Anderson et al.

(10) Patent No.: US 12,751,263 B2
(45) Date of Patent: Sep. 29, 2026

(54) LOCAL LINE EXTENSION FOR ENLARGED VIA-TO-LINE CONTACT AREA

(71) Applicant: INTERNATIONAL BUSINESS MACHINES CORPORATION, Armonk, NY (US)

(72) Inventors: Brent A. Anderson, Jericho, VT (US); Nicholas Anthony Lanzillo, Wynantskill, NY (US); Lawrence A. Clevenger, Saratoga Springs, NY (US); Ruilong Xie, Niskayuna, NY (US); Reinaldo Vega, Mahopac, NY (US); Albert M. Chu, Nashua, NH (US)

(73) Assignee: International Business Machines Corporation, Armonk, NY (US)

( * ) Notice: Subject to any disclaimer, the term of this patent is extended or adjusted under 35 U.S.C. 154(b) by 493 days.

(21) Appl. No.: 17/935,030

(22) Filed: Sep. 23, 2022

(65) Prior Publication Data

US 2024/0105506 A1 Mar. 28, 2024

(51) Int. Cl.
*H10W 20/00* (2026.01)
*H10W 20/41* (2026.01)
*H10W 20/42* (2026.01)

(52) U.S. Cl.
CPC ....... *H10W 20/089* (2026.01); *H10W 20/069* (2026.01); *H10W 20/42* (2026.01); *H10W 20/435* (2026.01)

(58) Field of Classification Search
CPC . H10W 20/089; H10W 20/069; H10W 20/42; H10W 20/435; H10W 20/43
See application file for complete search history.

(56) References Cited

U.S. PATENT DOCUMENTS

| | | | |
|---|---|---|---|
| 3,983,546 | A | 9/1976 | Zappe |
| 6,661,022 | B2 | 12/2003 | Morie et al. |
| 7,471,539 | B2 | 12/2008 | Oates et al. |
| 7,932,515 | B2 | 4/2011 | Bunyk |
| 8,056,039 | B2 | 11/2011 | Chanda et al. |
| 8,058,177 | B2 | 11/2011 | Weiss et al. |
| 8,247,846 | B2 | 8/2012 | Becker |
| 8,921,896 | B2 | 12/2014 | Becker et al. |
| 9,601,426 | B1 | 3/2017 | Bonilla |
| 9,893,262 | B2 | 2/2018 | Thompson et al. |
| 10,134,972 | B2 | 11/2018 | Oliver et al. |
| 10,354,912 | B2 | 7/2019 | Xu et al. |
| 10,515,894 | B2 | 12/2019 | Briggs et al. |
| 10,886,049 | B2 | 1/2021 | Strong |
| 11,195,799 | B2 | 12/2021 | Shao et al. |

(Continued)

FOREIGN PATENT DOCUMENTS

| | | | |
|---|---|---|---|
| CN | 112215359 | A | 1/2021 |

*Primary Examiner* — Shih Tsun A Chou
(74) *Attorney, Agent, or Firm* — Samuel A. Waldbaum

(57) ABSTRACT

An interconnect structure includes a first metal layer comprising at least one metal wire with a first segment and a local extension having a width in a first direction that is larger than a width of the first segment. A second metal layer is on top or below the first metal layer comprising at least one metal wire. A via is connected between the at least one metal wire of the first metal layer and the at least one metal wire of the second metal layer. A width of the via in the first direction is larger than the width of the first segment but smaller than a width of the second segment.

19 Claims, 6 Drawing Sheets

(56) References Cited

U.S. PATENT DOCUMENTS

| | | | |
|---|---|---|---|
| 2017/0308804 | A1 | 10/2017 | Wabnig et al. |
| 2019/0096751 | A1* | 3/2019 | Sato .................. H01L 21/76808 |
| 2022/0121978 | A1 | 4/2022 | Woods et al. |

* cited by examiner

LOCAL LINE EXTENSION FOR ENLARGED VIA-TO-LINE CONTACT AREA

BACKGROUND

Technical Field

The present disclosure generally relates to semiconductor metal interconnect structures, and more particularly, to forming metal interconnect structures between metal layers for better conductivity.

Description of the Related Art

Today, semiconductor fabrication of integrated circuits (ICs) includes front-end-of-line (FEOL) and back-end-of-line (BEOL) processes. The FEOL relates to the first aspect of IC fabrication and includes individual components, such as transistors, capacitors, resistors, inductors, etc. The FEOL includes gate patterning, spacer, extension, and source/drain implantation, silicide formation, and the like. The back-end-of-line (BEOL) is the second aspect of IC fabrication, where conductive wiring interconnect networks are established to form interconnect structures that electrically couple FEOL devices with one another. Typically, the wiring interconnect networks include two types of interconnect elements (often referred to as interconnects) that serve as electrical conductors, namely, conductive lines, such as lines that traverse a distance across the chip, and conductive vias that connect the conductive lines at different levels (typically referred to as metallization layers). The conductive lines and conductive vias are typically made of conductive material, such as aluminum or copper, and are electrically insulated by interlayer dielectrics (ILD).

SUMMARY

According to an embodiment, an interconnect structure includes a first metal layer comprising at least one metal wire with a first segment and a local extension having a width in a first direction that is larger than a width of the first segment. A second metal layer is on top or below the first metal layer, comprising at least one metal wire. A via is connected between the at least one metal wire of the first metal layer and the at least one metal wire of the second metal layer. A width of the via in the first direction is larger than the width of the first segment but smaller than a width of the second segment.

In one embodiment, a width of the local extension in a second direction is wider than a width in the second direction of the via.

In one embodiment, the local extension completely envelops a side surface of the via at the first metal layer.

In one embodiment, the first metal layer is vertically below the second metal layer.

In one embodiment, the at least one metal wire of the first metal layer is part of a plurality of metal wires arranged at a minimum wire pitch capability of the first metal layer.

In one embodiment, the local extension is offset from a center of the at least one metal wire of the first metal layer.

In one embodiment, the at least one metal wire of the first metal layer is created by a subtractive etch.

In one embodiment, the via is a dual damascene via.

In one embodiment, the via is self-aligned to the at least one metal wire of the first metal layer.

In one embodiment, the via is not self-aligned to the at least one metal wire of the first metal layer.

A method of interconnecting metal wires on different metal layers includes depositing a first metal layer. The first metal layer is etched to form at least one metal wire with a first segment and a local extension having a width in a first direction that is larger than a width of the first segment. An interlayer dielectric (ILD) layer is deposited. The ILD is deposited to provide an opening for a via. A second metal layer comprising at least one metal wire and the via is provided on top of the first metal layer. The via provides an electrical connection between the at least one metal wire of the first metal layer and the at least one metal wire of the second metal layer. A width of the via in the first direction is larger than the width of the first segment but smaller than a width of the second segment.

In one embodiment, a width of the local extension in a second direction is wider than a width in the second direction of the via.

In one embodiment, the local extension completely envelops a side surface of the via at the first metal layer.

In one embodiment, the first metal layer is vertically below the second metal layer.

In one embodiment, the at least one metal wire of the first metal layer is part of a plurality of metal wires arranged at a minimum wire pitch capability of the first metal layer.

In one embodiment, the local extension is offset from a center of the at least one metal wire of the first metal layer.

In one embodiment, the at least one metal wire of the first metal layer is created by a subtractive etch.

In one embodiment, the via is a dual damascene via.

In one embodiment, the via is self-aligned to the at least one metal wire of the first metal layer.

In one embodiment, the via is not self-aligned to the at least one metal wire of the first metal layer.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments.

Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION

Overview

Figure 1:
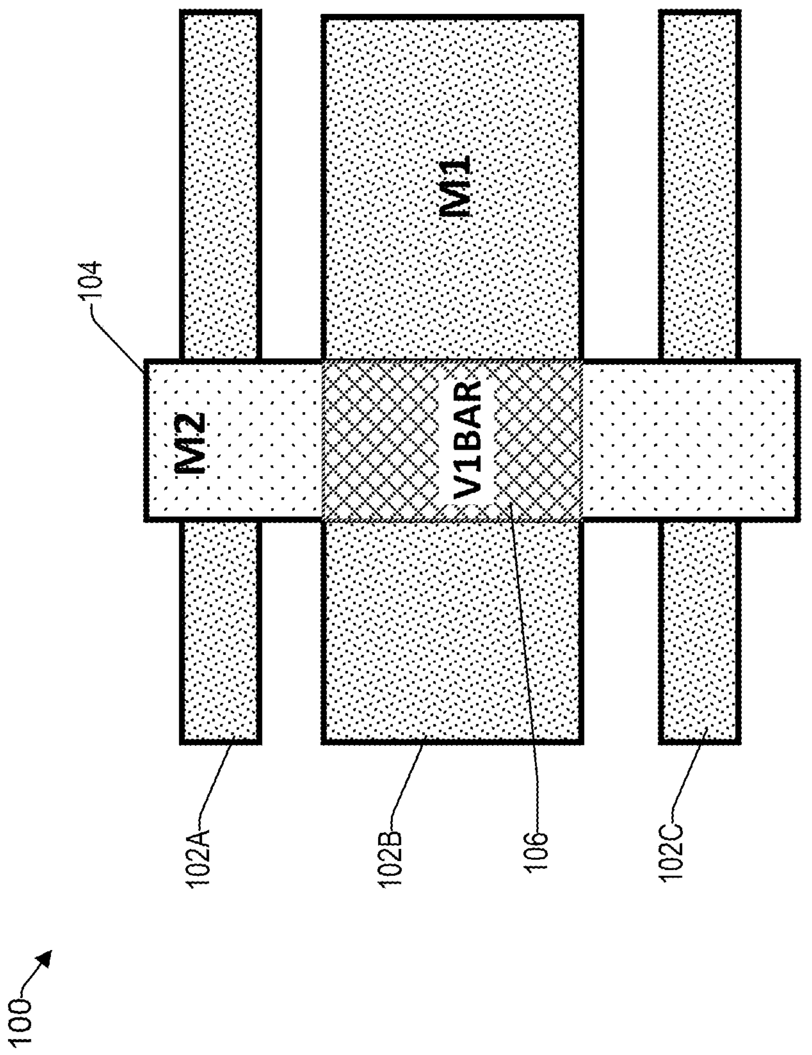
FIG. 1 (Prior Art)
FIG. 1 provides a top view of two metal layers electrically connected by a via.

In the following detailed description, numerous specific details are set forth by way of examples to provide a thorough understanding of the relevant teachings. However, it should be apparent that the present teachings may be practiced without such details. In other instances, well-known methods, procedures, components, and/or circuitry have been described at a relatively high-level, without detail, to avoid unnecessarily obscuring aspects of the present teachings.

In one aspect, spatially related terminology such as "front," "back," "top," "bottom," "beneath," "below," "lower," above," "upper," "side," "left," "right," and the like, is used with reference to the orientation of the Figures being described. Since components of embodiments of the disclosure can be positioned in a number of different orientations, the directional terminology is used for purposes of illustration and is in no way limiting. Thus, it will be understood that the spatially relative terminology is intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

As used herein, the terms "lateral" and "horizontal" describe an orientation parallel to a first surface of a chip.

As used herein, the term "vertical" describes an orientation that is arranged perpendicular to the first surface of a chip, chip carrier, or semiconductor body.

As used herein, the terms "coupled" and/or "electrically coupled" are not meant to mean that the elements must be directly coupled together-intervening elements may be provided between the "coupled" or "electrically coupled" elements. In contrast, if an element is referred to as being "directly connected" or "directly coupled" to another element, there are no intervening elements present. The term "electrically connected" refers to a low-ohmic electric connection between the elements electrically connected together.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

Example embodiments are described herein with reference to cross-sectional illustrations that are schematic illustrations of idealized or simplified embodiments (and intermediate structures). As such, variations from the shapes of the illustrations as a result, for example, of manufacturing techniques and/or tolerances, may be expected. Thus, the regions illustrated in the figures are schematic in nature and their shapes do not necessarily illustrate the actual shape of a region of a device and do not limit the scope.

It is to be understood that other embodiments may be used and structural or logical changes may be made without departing from the spirit and scope defined by the claims. The description of the embodiments is not limiting. In particular, elements of the embodiments described hereinafter may be combined with elements of different embodiments.

As used herein, certain terms are used indicating what may be considered an idealized behavior, such as, for example, "lossless," "superconductor," or "superconducting," which are intended to cover functionality that may not be exactly ideal but is within acceptable margins for a given application. For example, a certain level of loss or tolerance may be acceptable such that the resulting materials and structures may still be referred to by these "idealized" terms.

The concepts herein relate to forming metal interconnect structures between metal layers with less resistance, and hence, greater conductance. To better appreciate the teachings herein, it may be helpful to briefly discuss known architectures of vias between metal layers. In this regard, FIG. 1 provides a top view 100 of two metal layers (e.g., M1 and M2) electrically connected by a via 106. In order to provide better conductivity (e.g., reduce resistance between the connection between the first metal layer and the second metal layer), a proportionally larger via can be provided. In known architectures, the width of the via is limited to the width of the lines that are interconnected (e.g., M1 102B and M2 104). Stated differently, in order to provide a larger width via, the width of the metal wire below is typically relaxed (e.g., made wider) in order to accept the via coupled thereto. Consequently, in order to accommodate a more robust via, the pitch of a metal layer (e.g., M1 comprising 102A to 102C) is adversely affected by having to increase the width of metal wire 102B of the first metal layer. A substantially small (e.g., minimum) first metal wire pitch can therefore not readily be used. instead, the pitch is typically increased to accommodate the larger via 106. The teachings herein provide structures and methods that are able to maintain an aggressive wiring pitch, while improving conductivity between electrically connected metal wires. The techniques described herein may be implemented in a number of ways. Example implementations are provided below with reference to the following figures.

Example Interconnect Structures

Figure 2:
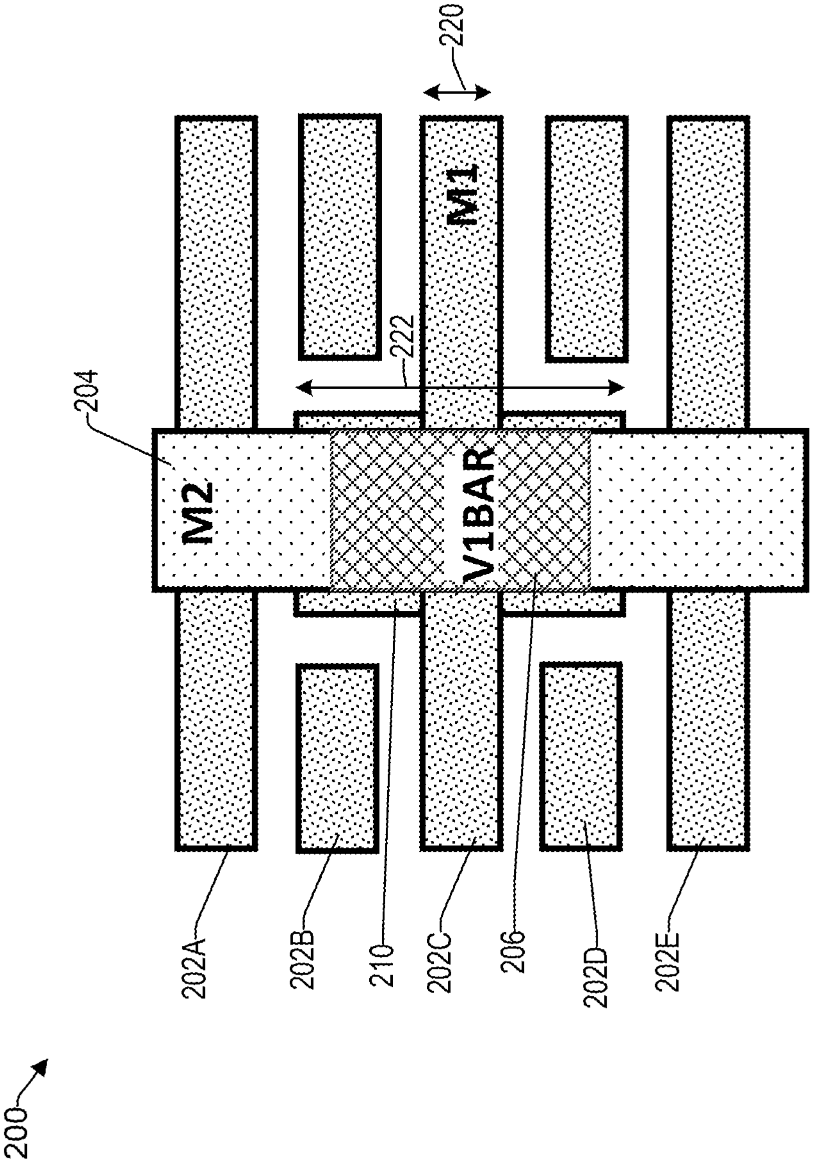
FIG. 2 provides an example back end of the line (BEOL) interconnect system that is able to maintain a substantially small pitch of one or more metal layers while accommodating a via that is larger than a minimum pitch of a metal layer, consistent with an illustrative embodiment.

By way of contrast, FIG. 2 provides an example back end of the line (BEOL) interconnect system 200 that is able to maintain a substantially small pitch (e.g., minimum pitch) of one or more metal layers while accommodating a via that is larger than a minimum pitch of a metal layer, consistent with an illustrative embodiment. There is a first metal layer comprising a plurality of lines (e.g., traces) 202A to 202E. In one embodiment, the pitch of the lines 202A to 203 may be a minimum pitch that is supported by the corresponding fabrication process. Line 202C of the first metal layer is electrically coupled to the line 204 of the second metal layer through a via 206. By virtue of using a wide via bar (e.g., wider than a pitch of a metal wire being connected to) the via 206 is able to reduce signal degradation between these vertically adjacent (e.g., one on top of the other in the direction of a supporting substrate) metallization layers (i.e., M2 and M1).

FIG. 2 illustrates a first metallization layer having an aggressive pitch (e.g., minimum pitch metal wiring). Line 202C has a first segment that has the benefit of the aggressive pitch and a second segment, sometimes referred to herein as a local extension 210 that has a width 222 in a first lateral direction (e.g., perpendicular to the direction of the line 202C) that is larger than a width of the first segment 220 to provide more contact area with the via 206. There is a second metal layer, either on top or below the first metal layer that may include one or more lines, such as metal wire 204. The via 206 is connected between the metal wire 202C of the first metal layer with the metal wire 204 of the second metal layer.

As illustrated, the width of the via 206 in a first direction (e.g., perpendicular to the direction of the metal wire 202C) is larger than the width 220 of the first segment but smaller than a width of the local extension. The local extension 210 completely envelops the side surface of the via 206 at the first metal layer, thereby providing additional contact area and less resistance as comparted to conventional interconnect structures, such as that shown in FIG. 1. By virtue of using a local extension 210 for the corresponding metallization layer (e.g., first metal layer in the example of FIG. 2), it allows a via 206 to land on an otherwise aggressive (e.g., minimum) pitch line.

In one embodiment, the lower metallization layer (e.g., first metal layer) is created by a subtractive etch. The via 206 can be created by either damascene process or a subtractive etch. In this regard, Applicants have determined that a subtractive etch of the lower metal layer as well as the wire extension provides higher quality metal wires (e.g., a tighter pitch). For example, as the dimensions (e.g., pitch) of interconnects shrink, there is a point at which metals such as ruthenium (Ru) or cobalt (Co) become lower in resistivity than traditional metals like copper (Cu). In this regard, Cu is formed using a damascene process, while Ru and Co can be formed using a subtractive process. Benefits of the subtractive process include: there is no etch-induced damage layer in the surrounding dielectric, line heights can be made very large without relying on deep, high-aspect ratio etching into dielectric, and the presence of liner/barrier materials surrounding the interconnect metals are not required. While an interconnect between a first metal layer and a second metal layer is depicted, it will be understood that interconnects between any metal layers are supported by the teachings herein.

Figure 3:
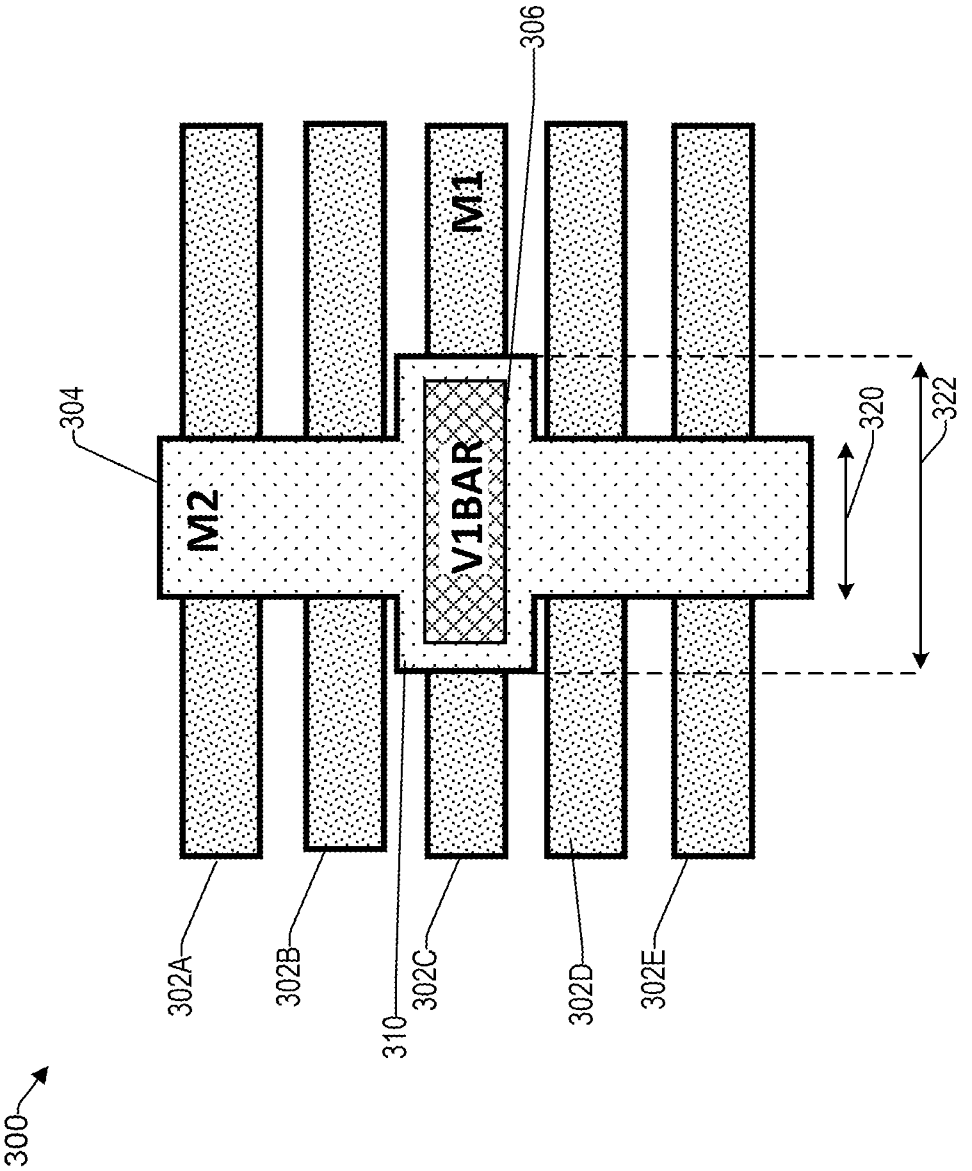
FIG. 3 illustrates another example of an interconnect system, where a metal wire of a second metal layer includes a local extension, consistent with an illustrative embodiment.

In various embodiments, the via connection 206 between the metal wires of the different metal layers has a width larger than the width of the line below, or the via connection between the metal wires of the different metal layers has a width larger than the width of the line above. In this regard, FIG. 3 illustrates another example of an interconnect system 300, where a metal wire 304 of a second metal layer includes a local extension 310, consistent with an illustrative embodiment. In the example of FIG. 3, the first metal layer includes a plurality of metal wires 302A to 302E that may have an aggressive (e.g., minimum) pitch. The metal wire 304 of the second metal layer, which is above the first metal layer (with respect to the substrate of a chip/wafer), includes a first segment having a first width and a local extension 304 (i.e., at the second metal layer) that has a width 322 that is larger than the width 320 of the first segment. As illustrated in FIG. 3, the width of the via 306 in a first lateral direction (i.e., in the direction of the metal wire 302C) is larger than the width 320 of the first segment but smaller than a width of the local extension 322 (i.e., in the direction of the metal wire 302C). The local extension 310 completely envelops the via 306 at the second metal layer, thereby providing additional contact area and less resistance as comparted to conventional interconnect structures, such as that shown in FIG. 1. For example, the structures discussed herein more completely envelop (e.g., wrap-around) the via at a respective metal layer. The wrap-around extends to the sides of the via by way of the local extension of the respective metal layer, thereby providing more (e.g., maximum) contact area between the via and the metal layer contacted to. In this way, conductivity is improved over conventional techniques.

Figure 4B:
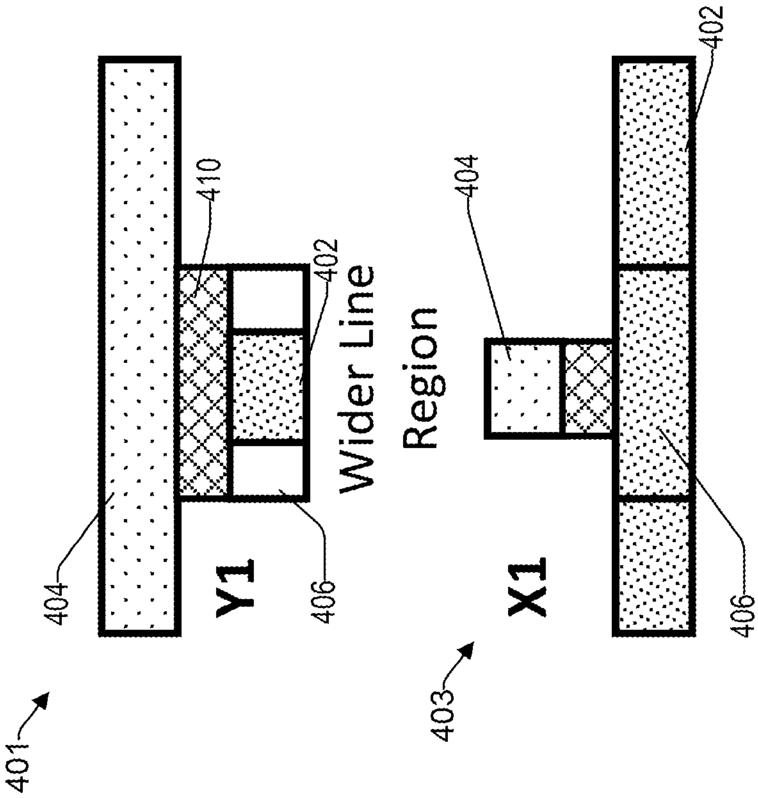
FIGS. 4A and 4B provide a top view and cross section views, respectively, of a self-aligned via process, consistent with an illustrative embodiment.
Figure 4A:
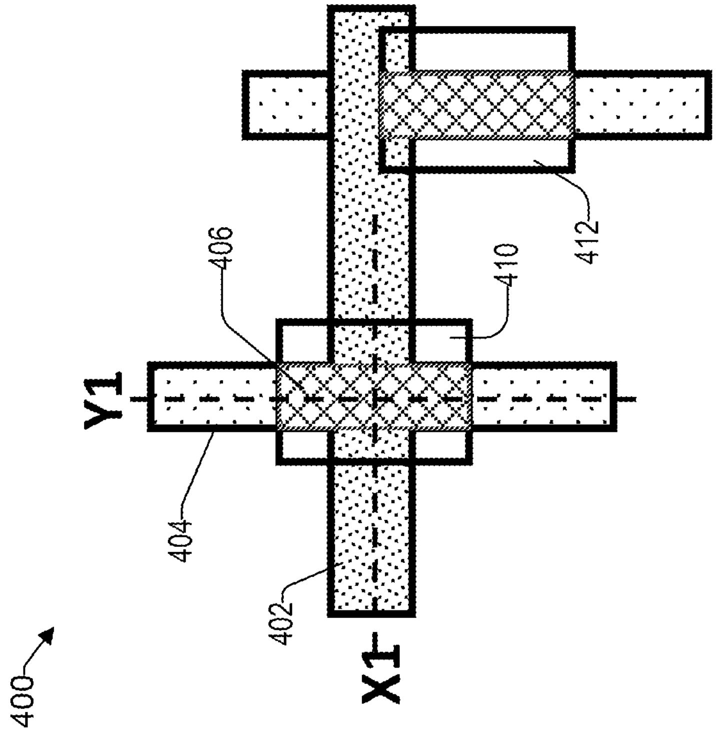

Reference now is made to FIGS. 4A and 4B, which provide a top view 400 and cross section views 401 and 403, respectively, of a self-aligned via process, consistent with an illustrative embodiment. FIG. 4A includes a metal wire 402 on a first metal layer placed in a first lateral direction. There is a second metal wire 404 on a second metal layer placed in a second lateral direction that is perpendicular to the first lateral direction. There is a via 406 that has a width in the second lateral direction that is wider that the width of the metal wire 402 of the first metal layer. To accommodate the wide (e.g., rectangular) via 406, the metal wire 402 of the first metal layer has a local extension 410 on the same metal layer as the first metal wire, having a width that is wider than the width of the first metal line 402. In various embodiments, the local extension can be centered with respect to the first metal line 402 (and/or the second metal line 404) or offset 412. In the self-aligned via process to the top metal line depicted in FIGS. 4A and 4B the via is configured to fit within the width of the upper line. The non-self-aligned provides larger via size and thus lower via resistance. Further, the self-aligned reduces reliability risk such as dielectric breakdown.

Figure 5B:
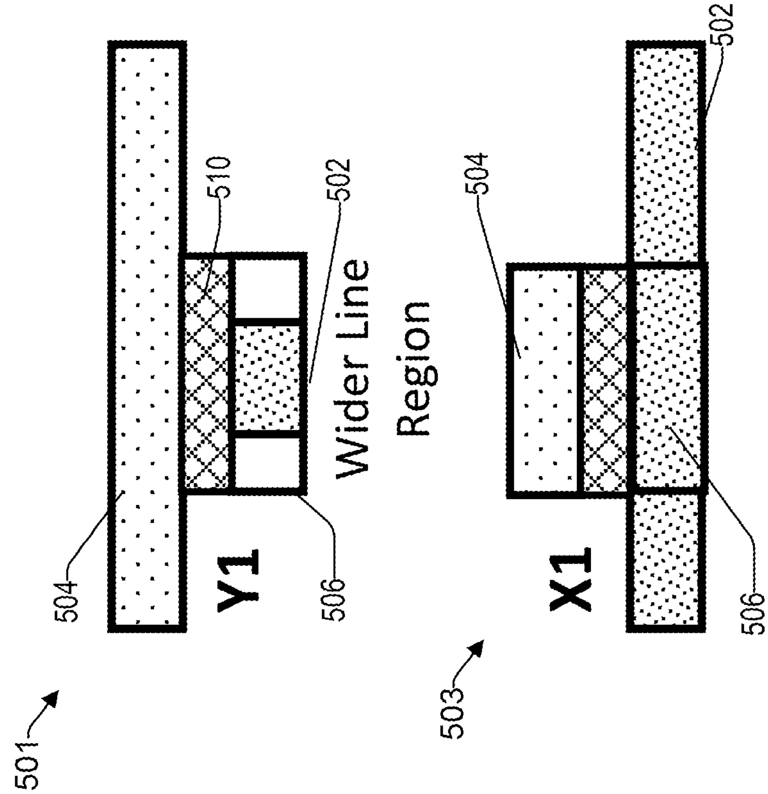
FIGS. 5A and 5B provide a top view and cross section views, respectively, of a non-self-aligned via process, consistent with an illustrative embodiment.
Figure 5A:
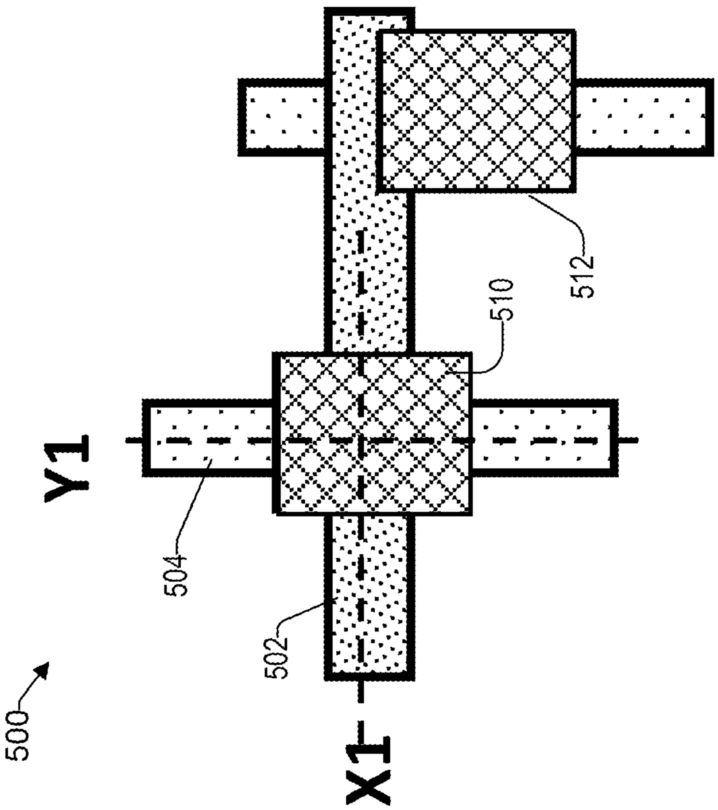

The structures discussed herein can also be fabricated without a self-aligned process. In this regard, FIGS. 5A and 5B provide a top view 500 and cross section views 501 and 503, respectively, of a non-self-aligned via process, consistent with an illustrative embodiment. FIG. 5A includes a metal wire 502 on a first metal layer placed in a first lateral direction. There is a second metal wire 504 on a second metal layer placed in a second lateral direction that is perpendicular to the first lateral direction. There is a via 506 that has a width in the second lateral direction that is wider that the width of the metal wire 502 of the first metal layer. To accommodate the wide (e.g., rectangular) via 506, the metal wire 502 of the first metal layer has a local extension 510 on the same metal layer as the first metal wire, having a width that is wider than the width of the first metal line 502. In various embodiments, the local extension can be centered with respect to the first metal line 502 (and/or the second metal line 504) or offset 512. The non-self-aligned via process depicted in FIGS. 5A and 5B. In the non-self-aligned process, the via can be larger (e.g., wider) than the width of the upper line.

The teachings herein provide various technical benefits, including, without limitation, improving the performance of the circuit using the via structure discussed herein because a lower via resistance is provided by improving (e.g., maximizing) contact are between lines on different metallization levels and vias. The V1BAR shapes can be used without involving an increase in the width and/or pitch of a wiring level vertically below it, thereby providing more design flexibility (e.g., being able to maintain an aggressive metal wiring pitch to which the via is connected thereto).

Example Processes for Superconducting Structures

Figure 6:
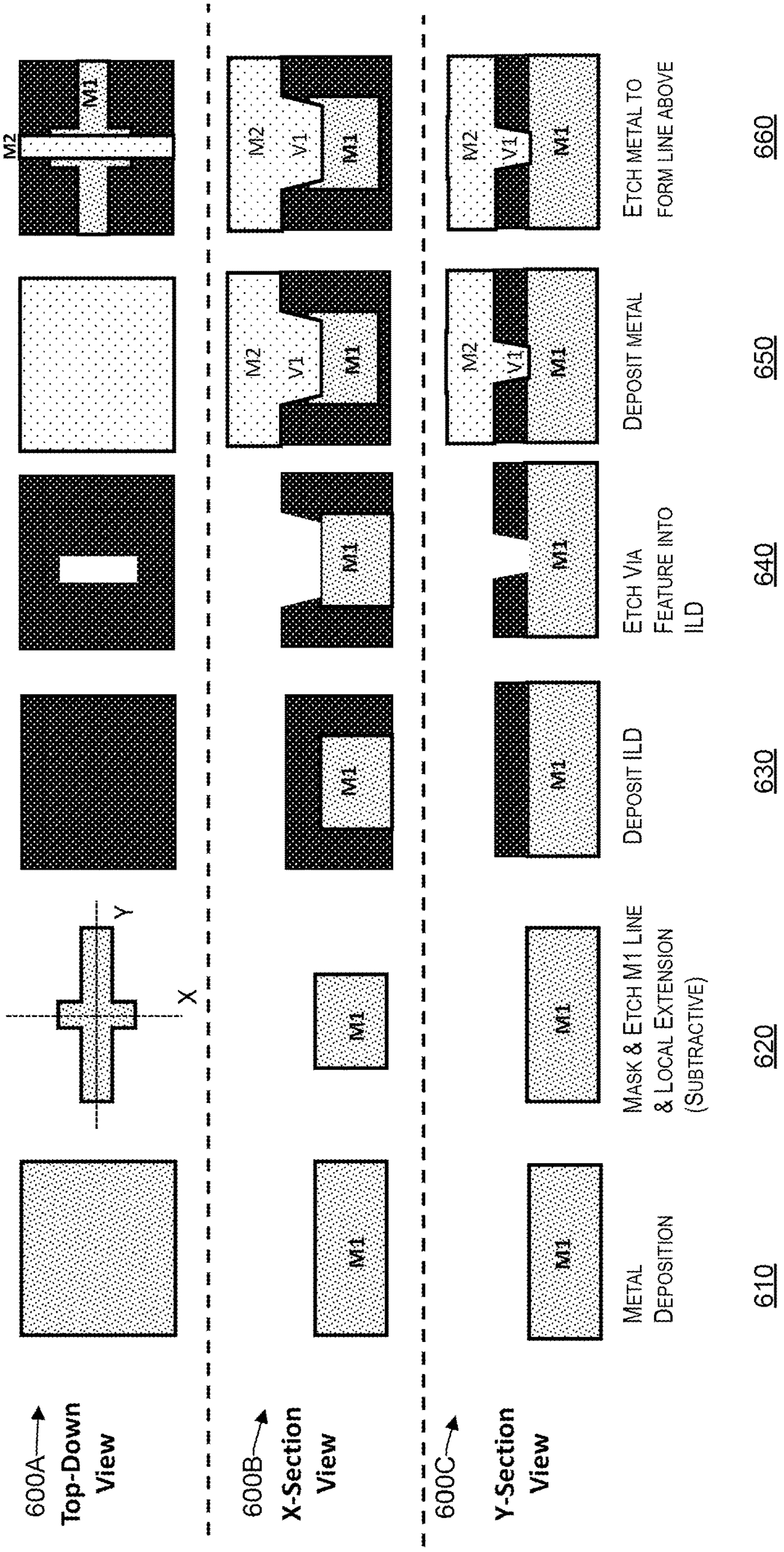
FIG. 6 illustrates various steps in the manufacture of a superconductor structure that interconnects different metal layers, consistent with an illustrative embodiment.

With the foregoing description of an example interconnect systems of FIGS. 2 to 5A/B, it may be helpful to discuss an example process of manufacturing the same. To that end, FIG. 6 illustrates various steps in the manufacture of a superconductor structure that interconnects different metal layers, consistent with an illustrative embodiment. More specifically, FIG. 6 illustrates a top view 600A, a first cross-section view (i.e., X) 600B, and a section cross-section view (i.e., Y) 600C of different fabrication steps involved in a BEOL interconnected structure. The Fabrication of the interconnected structure of FIG. 5 can comprise multi-step sequences of, for example, photolithographic and/or chemical processing steps that facilitate gradual creation of electronic-based systems, devices, components, and/or circuits in a semiconducting and/or a superconducting device (e.g., an integrated circuit). For instance, the structure can be fabricated on one or more substrates (e.g., a silicon (Si) substrates, and/or another substrate) by employing techniques including, but not limited to: photolithography, microlithography, nanolithography, nanoimprint lithography, photomasking techniques, patterning techniques, photoresist techniques (e.g., positive-tone photoresist, negative-tone photoresist, hybrid-tone photoresist, and/or another photoresist technique), etching techniques (e.g., reactive ion etching (RIE), dry etching, wet etching, ion beam etching, plasma etching, laser ablation, and/or another etching technique), evaporation techniques, sputtering techniques, plasma ashing techniques, thermal treatments (e.g., rapid thermal anneal, furnace anneals, thermal oxidation, and/or another thermal treatment), chemical vapor deposition (CVD), atomic layer deposition (ALD), physical vapor deposition (PVD), molecular beam epitaxy (MBE), electrochemical deposition (ECD), chemical-mechanical planarization (CMP), back-grinding techniques, and/or another technique for fabricating an integrated circuit.

At act 610, a first metal is deposited on a foundation. In various embodiment, the foundation may be a substrate or a FEOL that may include transistors, capacitors, resistors, inductors, and the like.

At act 620, one or more etching mask layer(s) may be provided, and the layers that are not protected thereby are removed. For example, as is understood by those of ordinary skill in the art, a mask layer (not shown), sometimes referred to as a photomask, may be provided by forming a layer of photoresist material on the metal layer, exposing the photoresist material to a pattern of light, and developing the exposed photoresist material. An etching process, such as a reactive ion etch (RIE), may be used to form patterns (e.g., openings) by removing portions of the first metal layer. After etching, the mask layer may be removed using a conventional plasma ashing or stripping process. Accordingly, the pattern of the mask layer facilitates the subtractive removal of portions of the first metal layer, thereby leaving behind a metal wire that has a local extension that can later be used as a landing area for an enlarged via, discussed in more detail below. Thus, a subtractive etch can be used to form a metal wire on a first metal layer having a local extension on the first metal layer. In the example of FIG. 6, a damascene via is illustrated, but, in various embodiments, the lines above/below can be damascene or subtractive.

At act 630, an interlayer dielectric layer (ILD) is deposited on top of the metal wire of the first metal layer using conventional deposition techniques. The dielectric layer acts as an insulator to prevent an electrical short between metal wires. In one embodiment, the ILD is a low-k material (e.g., k less than 4.2) based on silicon dioxide ($SiO_2$).

At act 640, a via opening is etched into the ILD using etching techniques discussed herein. The via length is longer than a lower line masking width. For example, the width of the via is larger than the width of the line (i.e., measured in the same direction), such that the via can “wrap-around” the line below.

At act 650, a via and a second metal layer are deposited. In one embodiment, the via and second metal layer comprise a same material and are deposited in a single deposition step, thereby simplifying processing and reducing fabrication cost.

At act 660, the second metal layer is etched to leave behind a metal wire on the second metal layer. In one embodiment, the width of the metal wire on the second metal layer has a minimum width (and a minimum pitch when a plurality of second metal wires are generated).

While the manufacture of a single interconnected structure is described for the purposes of discussion, it will be understood that other configurations, as well as those having multiple interconnected structures at different and multiple metal layers are supported by the teachings herein.

In one aspect, the method and structures as described above may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip may be mounted in a single chip package (such as a plastic carrier, with leads that are affixed to a motherboard or other higher-level carrier) or in a multichip package (such as a ceramic carrier that has either or both surface interconnections or buried interconnections). In any case, the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications, such as toys, to advanced computer products having a display, a keyboard or other input device, and a central processor.

Conclusion

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. An interconnect structure, comprising:

a first metal layer comprising at least one metal wire with a first segment and a local extension having a width in a first direction that is larger than a width of the first segment;

a second metal layer on top or below the first metal layer comprising at least one metal wire, wherein the first metal layer is below the second metal layer with respect to a substrate of the interconnect structure; and a via connected between the at least one metal wire of the first metal layer and the at least one metal wire of the second metal layer, wherein a width of the via in the first direction is larger than the width of the first segment but smaller than a width of the local extension.

2. The interconnect structure of claim 1, wherein a width of the local extension in a second direction is wider than a width in the second direction of the via.

3. The interconnect structure of claim 1, wherein the local extension completely envelops a side surface of the via at the first metal layer.

4. The interconnect structure of claim 1, wherein the at least one metal wire of the first metal layer is part of a plurality of metal wires arranged at a minimum wire pitch capability of the first metal layer.

5. The interconnect structure of claim 1, wherein the local extension is offset from a center of the at least one metal wire of the first metal layer.

6. The interconnect structure of claim 1, wherein the at least one metal wire of the first metal layer is created by a subtractive etch.

7. The interconnect structure of claim 1, wherein the via is a dual damascene via.

8. The interconnect structure of claim 1, wherein the via is self-aligned to the at least one metal wire of the first metal layer.

9. The interconnect structure of claim 1, wherein the via is not self-aligned to the at least one metal wire of the first metal layer.

10. An interconnect structure, comprising:

a first metal layer comprising at least one metal wire with a first segment and a local extension having a width in a first direction that is larger than a width of the first segment, wherein the at least one metal wire of the first metal layer is part of a plurality of metal wires arranged at a minimum wire pitch capability of the first metal layer;

a second metal layer on top or below the first metal layer comprising at least one metal wire;

a via connected between the at least one metal wire of the first metal layer and the at least one metal wire of the second metal layer, wherein a width of the via in the first direction is larger than the width of the first segment but smaller than a width of the local extension.

11. The interconnect structure of claim 10, wherein a width of the local extension in a second direction is wider than a width in the second direction of the via.

12. The interconnect structure of claim 10, wherein the local extension completely envelops a side surface of the via at the first metal layer.

13. The interconnect structure of claim 10, wherein the local extension is offset from a center of the at least one metal wire of the first metal layer.

14. The interconnect structure of claim 10, wherein the at least one metal wire of the first metal layer is created by a subtractive etch.

15. The interconnect structure of claim 10, wherein the via is a dual damascene via.

16. The interconnect structure of claim 10, wherein the via is self-aligned to the at least one metal wire of the first metal layer.

17. The interconnect structure of claim 10, wherein the via is not self-aligned to the at least one metal wire of the first metal layer.

18. An interconnect structure, comprising:

a first metal layer comprising at least one metal wire with a first segment and a local extension having a width in a first direction that is larger than a width of the first segment;

a second metal layer on top or below the first metal layer comprising at least one metal wire;

a via connected between the at least one metal wire of the first metal layer and the at least one metal wire of the second metal layer, wherein a width of the via in the first direction is larger than the width of the first segment but smaller than a width of the local extension, wherein the via is not self-aligned to the at least one metal wire of the first metal layer.

19. The interconnect structure of claim 18, wherein a width of the local extension in a second direction is wider than a width in the second direction of the via.

* * * * *